United States Patent [19]

Irving

[11] Patent Number: 4,593,052

[45] Date of Patent: * Jun. 3, 1986

[54] POLYMERIZABLE COMPOSITIONS CONTAINING DIPHENYLIODOSYL SALTS

[75] Inventor: Edward Irving, Burwell, England

[73] Assignee: Ciba-Geigy Corporation, Ardsley, N.Y.

[*] Notice: The portion of the term of this patent subsequent to Nov. 13, 2001 has been disclaimed.

[21] Appl. No.: 672,990

[22] Filed: Nov. 19, 1984

[30] Foreign Application Priority Data

Dec. 1, 1983 [GB] United Kingdom ............... 8332073

[51] Int. Cl.⁴ .......................... C08F 2/46; C08F 2/48
[52] U.S. Cl. ...................................... 522/31; 522/15;
522/25; 522/129; 522/130; 522/88; 522/89;
522/166; 522/168; 522/170; 525/58; 525/59;
525/118; 526/89; 526/210; 526/221; 526/216;
526/233; 526/234; 526/225; 528/88; 528/89;
528/90; 528/91; 528/92; 528/110; 528/122;
528/137; 528/138; 528/139; 528/141; 528/143;
430/280; 430/281; 528/361
[58] Field of Search ............... 204/159.18, 159.23;
430/280, 281, 286, 914, 925; 528/88–89, 90–92,
110–122, 135, 361, 137–139, 141, 143; 526/89,
210, 221, 216, 233–234, 225; 525/59, 58, 118

[56] References Cited

U.S. PATENT DOCUMENTS

| 4,090,936 | 5/1978 | Barton | 204/159.18 |
| 4,192,924 | 3/1980 | Crivello | 521/126 |
| 4,256,828 | 3/1981 | Smith | 430/280 |
| 4,307,177 | 12/1981 | Crivello | 204/159.18 |
| 4,374,751 | 2/1983 | Dudgeon | 252/426 |
| 4,383,025 | 5/1983 | Green et al. | 430/281 |
| 4,482,679 | 11/1984 | Irving | 525/327.3 |
| 4,518,686 | 5/1985 | Irving | 430/280 |
| 4,548,895 | 10/1985 | Irving et al. | 430/330 X |

FOREIGN PATENT DOCUMENTS

| 0104143 | 3/1984 | European Pat. Off. | 430/280 |
| 118044 | 9/1984 | European Pat. Off. | 204/159.23 |
| 2034317 | 6/1980 | United Kingdom | 204/159.23 |

OTHER PUBLICATIONS

F. M. Beringer et al., J. Org. Chem. 33, 2981, (1968).

Primary Examiner—Joseph L. Schofer
Assistant Examiner—Fred M. Teskin
Attorney, Agent, or Firm—Luther A. R. Hall

[57] ABSTRACT

Polymerizable compositions contain (A) a cationically polymerizable material, such as an epoxide resin, a phenoplast or a cyclic vinyl ether, (B) a hydroxy compound such as styreneallyl alcohol copolymer, and (c) an aromatic iodosyl salt of formula

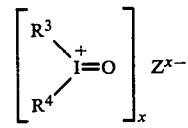

II where $R^3$ and $R^4$, which may be the same or different, each represent a monovalent aromatic radical having from 4 to 25 carbon atoms, x denotes 1, 2 or 3, and $Z^{x-}$ denotes an x-valent anion of a protic acid.

Suitable salts of formula II include diphenyliodosyl hexafluorophosphate and tetrafluoroborate. The compositions may be photopolymerized or they may be thermally polymerized in the presence, as catalyst for the iodosyl salt, of a salt or complex of a d-block transition metal, a stannous salt, an organic peroxide or an activated α-hydroxy compound.

The compositions may be used as surface coatings and adhesives, and in the preparation of printing plates, printed circuits and reinforced composites.

17 Claims, No Drawings

POLYMERIZABLE COMPOSITIONS CONTAINING DIPHENYLIODOSYL SALTS

This invention relates to compositions comprising a cationically polymerisable material, a hydroxy compound and an aromatic iodosyl salt. It also relates to the polymerisation of such compositions by means of actinic radiation or heat, and to the use of such compositions as surface coatings, in the preparation of printing plates and printed circuits, and as adhesives.

The desirability of inducing polymerisation in organic materials by means of actinic radiation is well known. Such procedures may, for example, avoid the use of toxic and/or inflammable solvents with their attendant problems of pollution and costs of recovery. Photopolymerisation enables insolubilisation of resin compositions to be restricted to defined areas, i.e., to those which have been irradiated, and so permits the production of printed circuits and printing plates or allows the bonding of substrates to be confined to required zones. Also, irradiation procedures are often more rapid than those involving heating and a consequential cooling step.

Photopolymerisable compositions containing a cationically polymerisable material, a hydroxy compound and an aromatic iodonium salt photopolymerisation catalyst have been disclosed. The presence of the hydroxy compound improves the flexibility of the photopolymerised composition.

Thus, U.S. Pat. No. 4,256,828 describes photopolymerisable compositions comprising a polyepoxide, an organic material having a hydroxyl functionality of at least 1 and, as photoinitiator, an aromatic iodonium salt of formula

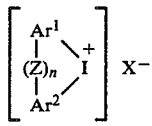

I in which $Ar^1$ and $Ar^2$ are aromatic groups having 4 to 20 carbon atoms which are phenyl, thienyl, furanyl or pyrazolyl groups, Z is an atom of oxygen or sulphur, or a group of formula $>S=O$, $>C=O$,

R—N< (where R is an aryl group having 6 to 20 carbon atoms or an acyl group of 2 to 20 carbon atoms), a carbon-to-carbon bond, or a group of formula

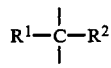

(in which $R^1$ and $R^2$ are each a hydrogen atom, an alkyl group of 1 to 4 carbon atoms or an alkenyl group of 2 to 4 carbon atoms), n is zero or 1, and $X^-$ is a tetrafluoroborate, hexafluorophosphate, hexafluoroarsenate, or hexafluoroantimonate anion.

U.S. Pat. No. 4,090,936 describes photohardenable liquid compositions comprising an organic material having an average epoxide functionality of 1 to 1.3, a compatible organic polymer having a glass transition temperature in the range from −20° C. to 105° C., the organic polymer being an acrylate or methacrylate polymer, a copolymer of styrene and allyl alcohol or a polyvinylbutyral, and an aromatic complex salt photoinitiator, which may be an aromatic iodonium salt of formula I.

The use of aromatic iodonium salts as heat-activated curing agents for cationically polymerisable materials in the presence of certain catalysts has been disclosed, for example in U.S. Pat. No. 4,192,924, where the catalyst is a mixture of a copper salt and ascorbic acid, an ascorbate, a stannous salt or an activated alpha-hydroxy compound, and in U.S. Pat. No. 4,374,751, where the catalyst is a peroxide.

In an article by F. M. Beringer and P. Bodlaender, J. Org. Chem., 1968, 33, 2981-4, various diaryliodosyl salts, and their preparation, are described. This article does not, however, give any indication of the behaviour of such salts when subjected to actinic irradiation or when heated in the presence of other organic materials, nor does it indicate any utility for the salts.

Surprisingly, it has now been found that aromatic iodosyl salts will act as photoinitiators for the polymerisation of compositions containing epoxides, or other cationically polymerisable materials, and hydroxy compounds, and that the salts will act as heat-activated polymerising agents for such compositions in the presence of certain catalysts. None of the above prior art references gives any indication that an iodosyl salt would have these valuable properties.

The aromatic iodosyl salts of the compositions of this invention are generally much more easily prepared than the aromatic iodonium salts of the prior art compositions, the iodonium salts generally requiring difficult preparative routes involving severe conditions. In the case of compositions containing certain types of cationically polymerisable material, particularly cycloaliphatic epoxide resins, compositions of the invention can be photopolymerised nore rapidly than corresponding compositions containing iodonium salts to give polymerised products of comparable flexibility. For compositions cationically polymerised using iodonium salts, those containing cycloaliphatic epoxide resins are usually more reactive than bisphenol-based epoxide resins. This difference in reactivity is much more marked in the case of compositions polymerised using aromatic iodosyl salts.

Accordingly, this invention provides polymerisable compositions comprising (A) a cationically polymerisable material, (B) an epoxide-free organic hydroxy compound having at least one alcoholic hydroxyl group, other than a compound which forms free radicals on heating at a temperature above 50° C., and (C) an aromatic iodosyl salt of formula

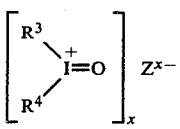

where
R³ and R⁴, which may be the same or different, each represent a monovalent aromatic radical having from 4 to 25 carbon atoms,
x denotes 1, 2 or 3 and
$Z^{x-}$ denotes an x-valent anion of a protic acid.

The invention further provides a process for the preparation of polymeric material which comprises
(i) subjecting a composition containing (A) a cationically polymerisable material, (B) an epoxide-free organic hydroxy compound having at least one alcoholic hydroxyl group, other than a compound which forms free radicals on heating at a temperature above 50° C., and (C) an iodosyl salt of formula II to radiation of wavelength such as to activate the iodosyl salt, preferably in the range 200 to 600 nm, and/or
(ii) subjecting the composition to heat in the presence, as catalyst for the iodosyl salt, of (D) a salt or complex of a d-block transition metal, a stannous salt, an organic peroxide or an activated α-hydroxy compound which forms free radicals on heating at a temperature above 50° C. until the composition is polymerised.

The cationically polymerisable material (A) may be, for example, a cyclic ether such as an oxetane or a tetrahydrofuran, a cyclic ester such as a lactone, an episulphide such as ethylene sulphide, a vinyl monomer such as a vinyl ether, a styrene or a vinyl carbazole, or a vinyl prepolymer. Preferably (A) is a 1,2-epoxide, such as ethylene oxide, propylene oxide, or an epoxide resin, a phenoplast, an aminoplast such as a ureaformaldehyde or melamine-formaldehyde resin, or a cyclic vinyl ether. Especially preferred cationically polymerisable materials are cycloaliphatic epoxide resins such as 3,4-epoxycyclohexylmethyl-3',4'-epoxycyclohexanecarboxylate and its 6,6'-dimethyl derivative, ethylene glycol bis(3,4-epoxycyclohexanecarboxylate), bis(3,4-epoxycyclohexylmethyl)adipate, dicyclopentadiene dioxide and vinylcyclohexene dioxide, polyglycidyl ethers, which may have been advanced, of polyhydric alcohols such as 1,4-butanediol and diethylene glycol and polyhydric phenols such as 2,2-bis(4-hydroxyphenyl)propane and phenol-aldehyde novolaks, cyclic vinyl ethers containing a dihydropyran residue, such as 3,4-dihydro-2H-pyran-2-ylmethyl(3,4-dihydro-2H-pyran-2-carboxylate), and phenol-formaldehyde resols. Mixtures of two or more cationically polymerisable materials can be used.

The hydroxy compound (B) is generally any epoxide-free organic material having one or more primary or secondary alcoholic hydroxyl groups which is not activated by other groups such that it forms free radicals on heating at temperatures above 50° C. Mixtures of hydroxy compounds can be used. Monohydroxy compounds, particularly those having molecular weights from 60 to 250, are useful in certain applications, for instance in formulating low viscosity coating compositions. Examples of suitable monohydroxy compounds are alkanols such as 1-butanol, 1-octanol, 1-decanol, cyclohexanol and cyclohexylmethanol, aralkyl alcohols such as benzyl alcohol, monoalkyl ethers of alkylene glycols, such as 2-methoxyethanol, 2-ethoxyethanol and 2-butoxyethanol, and monoalkyl ethers of polyoxyalkylene glycols, such as methyl and ethyl ethers of polyoxyethylene and polyoxypropylene glycols.

Generally, hydroxy compounds having 2 or more alcoholic hydroxyl groups, which may be primary and/or secondary, are preferred. Suitable polyhydroxy compounds are diols such as 1,4-butanediol and triols such as glycerol. Preferred polyhydroxy compounds have molecular weights of at least 100 and particularly more than 500. Examples of suitable compounds having such molecular weights are polyoxyalkylene glycols and triols, such as polyoxyethylene, polyoxypropylene and polyoxytetramethylene glycols and triols, polyepichlorohydrins, hydroxyl-terminated polycaprolactones, polymers of hydroxyalkyl acrylates and methacrylates, copolymers of allyl alcohol with a vinyl monomer such as styrene, polyvinyl alcohols, hydroxypropylcellulose, and hydroxyl-containing polyvinyl acetals.

Other suitable polyhydroxy compounds are materials containing secondary alcoholic hydroxyl groups prepared by reacting an epoxide resin (which may have been obtained by advancement of a lower molecular weight epoxide resin, particularly a polyglycidyl ether of a polyhydric phenol, for example by reaction with a dihydric phenol or a dicarboxylic acid) with an excess of a compound containing one or more groups reactive with epoxide groups, such as phenolic hydroxyl, carboxyl, primary or secondary amino, or mercapto groups. Further suitable polyhydroxy compounds are phenolic resols, that is resins produced by reacting a phenol with an excess of an aldehyde, such as phenol-formaldehyde resols. Where a phenol-formaldehyde resol is used as the cationically polymerisable material (A) in a composition of this invention, a hydroxy compound (B) which is a different resol or a compound other than a resol must also be present.

Particularly preferred hydroxy compounds are styrene-allyl alcohol copolymers, phenol-formaldehyde resols and secondary alcoholic hydroxyl group-containing resins made by reacting a diglycidyl ether of 2,2-bis(4-hydroxyphenyl)propane, which may have been advanced with 2,2-bis(4-hydroxyphenyl)propane, with an excess of a monohydric or dihydric phenol, especially phenol or 2,2-bis(4-hydroxyphenyl)propane.

The amount of hydroxy compound (B) present in the compositions of this invention may vary over a considerable range, depending on the compatibility of the hydroxy compound with the cationically polymerisable material and the physical properties required in the polymerised product. In general, when monohydroxy compounds are used they are present in an amount to provide from 0.001 to 0.2 equivalents of hydroxy compound per equivalent of epoxide or other cationically polymerisable material, and when polyhydroxy compounds are used they are present in an amount to provide from 0.001 to 10 equivalents of hydroxy compound per equivalent of cationically polymerisable material. Particularly suitable compositions containing the preferred polyhydroxy compounds contain from 0.8 to 1.2 equivalents of hydroxy compound per equivalent of cationically polymerisable material.

In the diaryliodosyl salts of formula II the groups R³ and R⁴ are preferably the same and are optionally-substituted mono-, di-, or tri-homocyclic or heterocyclic aromatic groups. Examples of suitable heterocyclic aromatic groups are thienyl, furyl, pyridyl, and pyrazolyl groups. Examples of suitable tricyclic aromatic groups are anthryl, phenanthryl, and fluorenyl groups, while suitable mono- and dicyclic aromatic groups are phenyl and naphthyl groups and groups of formula

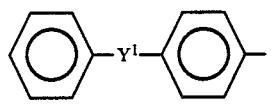
III where $Y^1$ denotes a carbon-carbon bond, an ether oxygen atom, or a group of formula —$CH_2$— or —$C(CH_3)_2$—. Any of these aromatic groups may, if desired, be substituted by one or more atoms or groups which do not interfere with the liberation of an acid species when the salt is irradiated or heated, Typical such substituents include alkyl and alkoxy groups of 1 to 4 carbon atoms, nitro groups. and halogen atoms. Preferably, $R^3$ and $R^4$ are each optionally substituted phenyl, especially phenyl or phenyl substituted by an alkyl group of 1 to 4 carbon atoms, especially a methyl or isopropyl group, a halogen atom, especially a fluorine atom, or a nitro group.

Suitable anions $Z^{x-}$ are those derived from organic carboxylic acids, such as acetates and trifluoroacetates, those derived from organic sulphonic acids Y—$SO_3H$, where Y denotes an aliphatic, aromatic or aliphatic-substituted aromatic group, preferably of 1 to 20 carbon atoms, any of which may be substituted by one or more halogen atoms, such as methanesulphonates, benzenesulphonates, toluene-p-sulphonates, and trifluoromethanesulphonates, and particularly those derived from inorganic acids, typically halides, such as fluorides, chlorides, and bromides, halates, such as iodates, perhalates such as perchlorates, and also nitrates, sulphates, hydrogen sulphates, phosphates, hydrogen phosphates, and complex anions such as pentafluorohydroxoantimonates and those of formula $MQ_w^-$, where M represents an atom of a metal or metalloid,
Q represents a halogen atom, and
w is an integer of from 4 to 6 and is one more than the valency of M.

Anions of formula $MQ_w^-$ are preferably polyhalides of antimony, arsenic, bismuth, iron, tin, boron, and phosphorus, such as hexafluoroantimonate, hexachloroantimnate, hexafluoroarsenate, pentachlorobismuthate, tetrachloroferrate, hexachlorostannate, tetrafluoroborate, or hexafluorophosphate, the two last-named being especially preferred.

Any cationically polymerisable material may be polymerised by exposure to radiation or heat in the presence of a suitable diaryliodosyl salt of formula II. However, not any such material is polymerised by all such salts; the precise nature of the material and that of the anion $Z^{x-}$ is critical and must be selected to give an effective result. Matching a cationically polymerisable naterial with a suitable anion is well within the knowledge of those skilled in the art of curing or polymerising cationically polymerisable compositions. For example, salts containing anions derived from organic carboxylic acids, organic sulphonic acids, and inorganic acids, especially acetates, trifluoroacetates, methanesulphonates, benzenesulphonates, toluene-p-sulphonates, trifluoromethanesulphonates, fluorides, chlorides, bromides, iodates, perchlorates, nitrates, sulphates, hydrogen sulphates, phosphates or hydrogen phosphates are capable of curing phenoplasts, such as phenol-formaldehyde resins, and aminoplasts, such as urea-formaldehyde and melamine-formaldehyde resins. Salts containing a metal halogenide or metalloid halogenide anion are capabe of curing epoxide resins or episulphide resins, or polymerising mono-1,2-epoxides, monoepisulphides or vinyl ethers. Other materials which may be polymerised by heating or irradiation in the presence of an iodonium salt may be polymerised by irradiation in the presence of a suitable diaryliodosyl salt of formula II or by heating in the presence of such a salt and a catalyst (D) therefor.

The amount of diaryliodosyl salt present in the compositions is not usually critical, since only catalytic amounts are necessary to bring about curing or photopolymerisation. Generally there will be employed from 0.01% to 10%, and preferably from 0.5 to 5%, by weight, calculated on the weight of cationically polymerisable material (A).

Diaryliodosyl salts of formula II may be prepared by a method similar to that described by F. M. Beringer and P. Bodlaender, loc. cit. An iodoarene of formula IV is oxidised to the corresponding iodoxyarene of formula V, using peracetic acid. Treatment of the iodoxyarene, or a mixture of two iodoxyarenes, with an alkali metal hydroxide gives the iodosyl hydroxide of formula VI, which may be converted into the carbonate of formula VII by treatment with carbon dioxide. This hydroxide or carbonate is treated with an acid of formula $H_xZ$ (where such acids exist) to form the desired salt. (Direct neutralisation of the iodosyl hydroxide sometimes leads to lower yields of the desired salt than if it is first converted into the carbonate.) Where such acids do not exist in the free state, or are difficult to handle, the hydroxide or carbonate may be treated e.g., with acetic acid or trifluoroacetic acid to form the corresponding acetate of formula VIII or trifluoroacetate of formula IX. Such a salt is treated with an alkali metal or ammonium salt of the acid $H_xZ$, e.g., a phosphate, hexafluorophosphate, tetrachloroferrate or hexafluoroantimonate to give the desired product of formula II by double decomposition.

These reactions are shown in the following scheme:

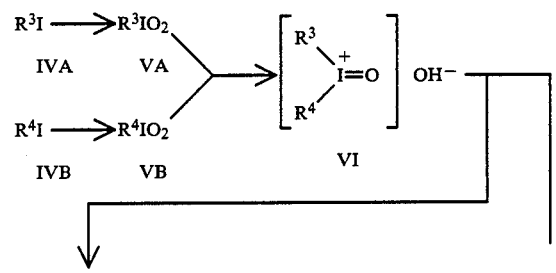

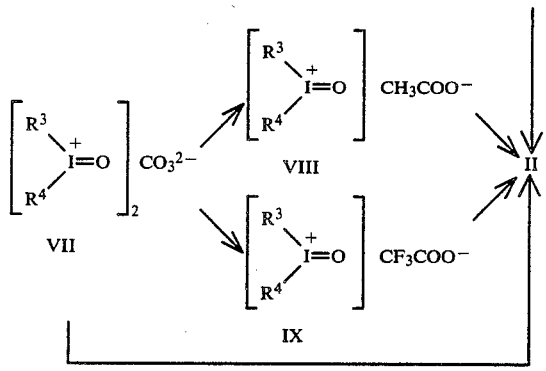

Hexafluoroantimonates may be made by addition of solid sodium or potassium hexafluoroantimonate to an aqueous solution of the iodosyl acetate or trifluoroacetate: if the sodium or potassium salt is first dissolved in water, then, due to hydrolysis, the product isolated is the hydroxopentafluoroantimonate ($Z^{x-} = SbF_5(OH)^-$).

When the compositions of this invention are to be photopolymerised, they may also contain a photochemical free-radical generator or a photosensitiser. We have found that, by incorporation of suitable such accelerators, the speed of curing is further increased, thereby permitting the use of shorter exposure times and/or of less powerful sources of irradiation. The particular free radical generators preferred are aromatic carbonyl compounds. Although they have been used for free-radical polymerisation of ethylenically-unsaturated compounds it is surprising that they accelerate cationic polymerisation.

Suitable aromatic carbonyl compounds include ketals of aromatic diketones, particularly compounds of formula

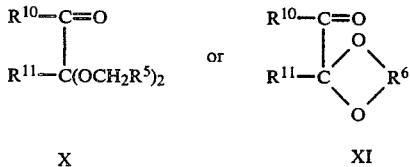

where $R^5$ represents a hydrogen atom, an alkyl group of 1 to 5 carbon atoms, an alkenyl group of 2 or 3 carbon atoms, an aralkyl group of 7 to 9 carbon atoms, an aralkenyl group of 8 or 9 carbon atom, or a group of formula $-(CH_2)_mR^7$.

$R^6$ represents a group of formula $-CH_2CH(R^9)-$ or $-CH_2CH(R^9)CH_2-$, $R^7$ denotes a halogen atom or a group of formula $-OR^8$, $-SR^8$, $-OR^{12}$, $-SR^{12}$, $-OCOR^8$, or $-COOR^8$, m is 1, 2, or 3, $R^8$ denotes an alkyl group of 1 to 4 carbon atoms, $R^9$ denotes a hydrogen atom or an alkyl group of 1 to 18 carbon atoms, and $R^{10}$, $R^{11}$, and $R^{12}$ each independently represent a phenyl group which is unsubstituted or is substituted by up to 3 substituents chosen from halogen atoms, alkyl or alkoxy groups of 1 to 4 carbon atoms, and phenyl groups.

Examples of compounds of formula X are benzil dimethyl ketal, benzil diethyl ketal, benzil di(2-methoxyethyl) ketal, and benzil di(2-chloroethyl) ketal. Examples of compounds of formula XI are 2-phenyl-2-benzoyl-4-methyl-1,3-dioxolane and 2-phenyl-2-benzoyl-1,3-dioxane. The particularly preferred such aromatic carbonyl compound is benzil dimethyl ketal.

Compounds of formula X or of formula XI are described in U.S. Pat. No. 4,190,602, where they are employed for the photopolymerisation and photocrosslinking of ethylenically-unsaturated compounds such as methyl acrylate, styrene-containing polyesters based on maleic acid, and diallyl phthalate prepolymers.

Other substances suitable for use as the photoaccelerator include aromatic-aliphatic ketones of one of the formulae

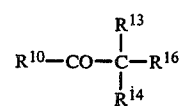 XII

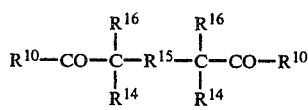 XIII

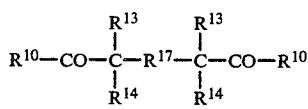 XIV and

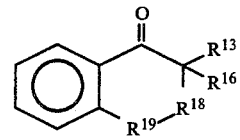 XV where $R^{10}$ has the meaning assigned above, $R^{13}$ and $R^{14}$ each denote a monovalent aliphatic, cycloaliphatic, or aralphatic group, or together with the attached carbon atom may denote a cycloalkylene group, $R^{15}$ represents a carbon-carbon bond or a divalent organic radical $R^{16}$ represents a hydroxyl group or an amino group, or a monovalent etherified or silylated such group, $R^{17}$ represents a divalent amino, ether, or siloxy group, $R^{18}$ represents a direct chemical bond or $-CH_2-$, and $R^{19}$ represents $-O-$, $-S-$, $-SO_2-$, $-CH_2-$, or $-C(CH_3)_2-$.

These compounds, preferred members of which include 2-allyloxy-2-methylpropiophenone, 2-benzyloxy-2-methylpropiophenone, 2-hydroxy-2-methyl-p-phenoxypropiophenone, 1-benzoylcyclohexanol, 1-benzoylcyclopentanol, and bis(4-(α-hydroxyisobutyryl)-phenyl) ether, are likewise described as photopolymerisation catalysts for ethylenically-unsaturated compounds and as photocrosslinkers for polyolefins in U.S. Pat. No. 4,308,400.

Other compounds which may be used to enhance the photopolymerising rate of the salts of formula II are 2-substituted thioxanthones of formula

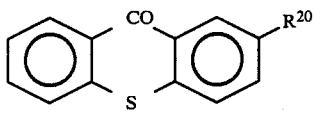

XVI.

where $R^{20}$ denotes either a chlorine atom or an alkyl group of 1 to 6 carbon atom such as an isopropyl or tert.butyl group. Compounds of formula XVI, especially the 2-chloro compound, are used commercially as photopolymerisation catalysts for ethylenically-unsaturated compounds and as photocrosslinkers for polyolefins.

We prefer to include from 30% to 125%, and especially from 50% to 100%, by weight of the photoaccelerator, calculated on the weight of the diaryliodosyl salt of formula II.

The compositions may also contain photosensitisers such as polyarylenes (e.g., perylene and 9,10-diethoxyanthracene), polyarylpolyenes, 2,5-diarylisobenzofurans, 2,5-diarylfurans, 2,5-diarylthiofurans, 2,5-diarylpyrroles, 2,5-diarylcyclopentadienes, polyarylphenylenes, coumarin, and polyaryl-2-pyrazolines.

When the compositions of this invention are to be polymerised substantially by means of heat alone, may also contain, as catalyst for the iodosyl salt, (D) a salt or complex of a d-block transition metal, a stannous salt, an organic peroxide or an activated α-hydroxy compound which forms free radicals on heating to a temperature above 50° C.

Organic peroxides that may be used as the catalyst (D) in the curable compositions of this invention include dicumyl peroxide, tert.butyl perbenzoate, tert.butyl peroxide, and, especially, benzoyl peroxide. A preferred stannous salt is stannous chloride.

The catalyst (D) is preferably a salt or complex of a d-block transition metal or an activated α-hydroxy compound. The d-block transition metals are those of the first transition series, from scandium to zinc, and those of the second transition series, from yttrium to cadmium. The preferred d-block transition metals, the salts or complexes of which are used as catalyst (D) are zinc, cobalt, chromium, iron and, more especially preferred, copper. The salts may be of organic or mineral acids, such as chlorides, acetates, trichloroacetates, naphthenates, octanoates, and oxalates. Suitable complexes are π-orbital complexes and those formed with ligands which form inner complexes and are aldehydes, ketones, carboxamides, and aliphatic aminomonocarboxylic and aminopolycarboxylic acids. Especially preferred complexes are those formed with 1,3-diketones such as acetylacetone, its homologues, e.g., benzoylacetone, and its derivatives, e.g., ethyl acetoacetate.

The activated α-hydroxy compound is a compound having a hydroxy group attached to a carbon atom which is alpha to an activating group such as a carbonyl group or a carbon atom having a hydroxy group attached thereto, the compound forming free radicals on heating. Suitable activated α-hydroxy compounds include ascorbic acid, ketones such as acyloins and benzoins, and activated diols such as pinacol and its homologues, especially benzpinacol.

If desired, certain of the catalysts (D) may be used together, for example, a transition metal salt or complex, such as copper acetylacetonate or cupric benzoate, may be used with ascorbic acid or with benzpinacol.

The amount of catalyst (D) is not critical but will generally be from 10% to 150% by weight, calculated on the weight of diaryliodosyl salt used.

Other materials which may be incorporated in the compositions of this invention include diluents, fillers such as silica, talc, glass microballoons, clays, powdered metals or zinc oxide, viscosity modifiers such as asbestos, rubbers, tackifiers, and pigments.

On exposing a composition of this invention to radiation of suitable wavelength, the iodosyl salt photoinitiator is activated, apparently through liberation of an acidic species, to bring about polymerisation and, where the composition contains a curable cationically polymerisable material such as an epoxide resin or phenolic resin, crosslinking of the composition. Radiation used in the process of the present invention may be exclusively ultraviolet radiation or it may be radiation having wavelengths in both the ultraviolet and visible regions of the spectrum. The compositions may also contain dyes so that they are responsive to visible regions of the spectrum. Suitable dyes are disclosed in, for example, U.S. Pat. No. 4,026,705, and are usually cationic, such as acridine yellow, acridine orange, phosphine R, benzoflavin, setoflavin T, and their mixtures.

The preferred wavelength for radiation used in the process of this invention is within the range 200 to 600 nm, especially 200 to 400 nm. The selection, from commercially available equipment, of a suitable radiation source emitting radiation within this wavelength range is a routine matter for those skilled in the art of photopolymerisation.

Ihe compositions of this invention which contain a catalyst (D) are rapidly polymerised by heating to a temperature above 50° C., preferably to a temperature within the range 80° to 180° C. The compositions may be heated for 1 to 200 minutes, durations of 1 to 30 minutes being preferred.

When the compositions of this invention contain a curable cationically polymerisable material, especially an epoxide resin or a phenoplast, they may be partially cured by irradiation and then fully cured by heating. For a two-stage curing process the composition contains either a catalyst (D) to enhance heat cure by the iodosyl salt, or another heat-activated curing agent for the curable material. Such heat-activated curing agents are known and it is within the routine skill of those familiar with curing processes to select a heat-curing agent that is suitable for the particular curable material. If it is desired to keep the partially cured material for subsequent processing involving heat-curing, it is, of course, important that irradiation is carried out at a temperature below that at which substantial heat-curing of the photopolymerised product by means of the heat-curing agent would occur.

Thus, compositions of this invention containing epoxide resins or phenoplasts can be cured in two stages. Where the phenoplast is a novolak, which is not polymerisable under the influence of the iodosyl salt, it is used together with a material which is polymerisable under its influence suoh as an epoxide resin or a cyclic vinyl ether. The composition is first converted into the partially cured B-stage by exposing it to actinic radiation in the presence of a latent, heat-activated crosslinking agent for the epoxide resin or phenoplast (optional where the phenoplast is a resol) and, in a second stage, the partially cured composition is heated so that curing is completed. Thus a liquid or semiliquid composition may be prepared, which may then be shaped or used to impregnate a substrate while being irradiated to solidify it; the solidified body may then be heated, when desired, to complete the cure of the resin.

Suitable heat-activated crosslinking agents for epoxide resins include polycarboxylic acid anhydrides, complexes of amines, especially primary or tertiary aliphatic amines such as ethylamine, trimethylamine, and n-octyldimethylamine, with boron trifluoride or boron trichloride, and latent boron difluoride chelates. Aromatic polyamines and imidazoles are usually not preferred, because indifferent results are obtained, possibly due to reaction between the acid catalyst liberated and the amine. Dicyandiamide can be used successfully, providing it is in relatively coarse particles.

Suitable heat-activated crosslinking agents for novolaks include hexamethylenetetramine and paraform.

The temperature and duration of heating required for the thermal curing after photopolymerisation, and the proportions of heat-activated curing agent, are readily found by routine experimentation and easily derivable from what is already well known concerning the heat-curing of epoxide resins and phenolaldehyde resins.

Compositions containing resins having epoxide groups or phenolic hydroxyl groups through which they can be heat-cured after photopolymerisation are particularly useful in the production of multilayer printed circuits.

The compositions of this invention may be used as surface coatings. They may be applied to a substrate such as steel, aluminium, copper, cadmium, zinc, paper, or wood, preferably as a liquid, and irradiated or heated. By photopolymerising part of the coating, as by irradiation through a mask, those sections which have not been exposed may be washed with a solvent to remove the unpolymerised portions while leaving the photopolymerised, insoluble portions in place. Thus the compositions of this invention may be used in the production of printing plates and printed circuits. Methods of producing printing plates and printed circuits from photopolymerisable compositions are well known.

The compositions may also be used as adhesives. A layer of the composition may be sandwiched between two surfaces of objects, then the assembly irradiated and/or heated to complete the polymerisation. When photopolymerisation is to be employed, it is, of course, necessary that at least one of the objects be of glass or other material which is transparent to the actinic radiation.

The compositions are also useful in the production of fibre-reinforced composites, including sheet moulding compounds.

They may be applied directly, continuously or batchwise, in liquid form, to reinforcing fibres (including strands, filaments, and whiskers), which may be in the form of woven or nonwoven cloth, unidirectional lengths, or chopped strands, especially of glass, boron, stainless steel, tungsten, alumina, silicon carbide, asbestos, potassium titanate whiskers, an aromatic polyamide such as poly(m-phenylene isophthalamide), poly(p-phenylene terephthalamide), or poly(p-benzamide), polyethylene, polypropylene, or carbon. When the composition contains a heat-curable material such as an epoxide resin, the impregnated fibrous material may be irradiated to photopolymerise and solidify the composition, thereby producing a prepreg and, when desired, the prepreg may be heated under pressure, optionally together with other prepregs or fibrous layers, to produce a cured fibre-reinforced composite.

The compositions of this invention are useful in the production of putties and fillers. They may be used as dip-coatings, an article to be coated being dipped in the liquid composition, withdrawn, and the adhering coating being irradiated to photopolymerise (and hence solidify it) and subsequently, if desired, being heated.

In another application, a layer of the composition in liquid form is irradiated until it solidifies, producing a film adhesive, which is then placed between, and in contact with, two surfaces which are to be bonded together, and the assembly is heated to complete crosslinking of the composition. The film may be provided on one face with a strippable backing sheet, e.g., of a polyolefin or a polyester, or of cellulosic paper having a coating of a silicone release agent. Manipulation of the assembly is often easier if the film has a tacky surface. This may be produced by coating the film with a substance which is tacky at room temperature but which crosslinks to a hard, insoluble, infusible resin under the conditions of heat employed to complete crosslinking of the composition. However, an adequate degree of tackiness often exists without additional treatment, especially if polymerisation of the composition has not proceeded too far. Suitable adherends include metals such as iron, zinc, copper, nickel, and aluminium, ceramics, glass, and rubbers.

The invention is illustrated by the following Examples in which all parts are by weight.

Iodosyl salts are prepared as follows:

Iodoxybenzene (4.72 g) is added to 1-Normal aqueous sodium hydroxide solution (40 ml) at 0° C. and stirred vigorously. After 2 hours the precipitated sodium iodate is removed by filtration and carbon dioxide is bubbled through the filtrate until the solution is neutral. 1-Normal acetic acid solution is added slowly to liberate carbon dioxide, a slight excess being added. Diphenyliodosyl acetate monohydrate is filtered off as a white solid, m.pt. 105°–110° C. (decomp.), 2.76 g being obtained.

This monohydrate (1.87 g) is dissolved in boiling water (25 ml). The solution is treated with decolourising charcoal and filtered hot. A saturated aqueous solution of potassium hexafluorophosphate is added slowly until addition causes no further precipitation. The mixture is then cooled and filtered. The residue is dried over phosphorus pentoxide in vacuo at room temperature to give diphenyliodosyl hexafluorophosphate (0.87 g), m.pt. 120°–130° C. (decomp.).

Iodoxybenzene (35.4 g) is added to 1-Normal sodium hydroxide (300 ml) at 0° C. and stirred vigorously. After 2 hours the mixture is filtered and carbon dioxide is bubbled through the filtrate until the solution is neutral. A portion of this carbonate solution (100 ml) is treated slowly with fluoroboric acid (40%) until evolution of carbon dioxide ceases. A further quantity of the acid (2 ml) is then added and the precipitate is filtered off. This precipitate is washed with ice-cold water and dried to give diphenyliodosyl tetrafluoroborate (2.4 g) melting in the range 110°–120° C. (decomp.).

Bis-(4-methylphenyl)iodosyl trifluoroacetate (1.16 g; prepared as described by F. M. Beringer and P. Bodlaender, loc. cit.) is dissolved in boiling water (10 ml), filtered, and the filtrate is treated with potassium hexafluorophosphate (0.49 g) as a saturated aqueous solution. The mixture is evaporated to about half its volume, and the precipitate is filtered off. The precipitate is then dried to give bis(4-methylphenyl)iodosyl hexafluorophosphate (0.68 g), melting at 125° C. (decomp.).

Bis(2-methylphenyl)iodosyl trifluoroacetate (0.7 g; prepared according to the method of F. M. Beringer and P. Bodlaender, loc. cit.) is dissolved in boiling water (25 ml) and potassium hexafluorophosphate (0.45 g) in water (5 ml) is added. The resulting solution is cooled, the precipitate which forms is collected by filtration and dried to give bis(2-methylphenyl)iodosyl hexafluorophosphate (0.4 g), m.pt. 148°–150° C. (decomposition).

Diphenyliodosyl trifluoroacetate (1.2 g; prepared according to the method of F. M Beringer and P. Bodlaender, loc. cit,) is dissolved in hot water, treated with charcoal and filtered hot. An aqueous solution of potassium hexafluoroarsenate (0.7 g) is added to the filtrate and the resultant solution cooled. The white precipitate which forms is collected by filtration and dried in air to give diphenyliodosyl hexafluoroarsenate (0.64 g), m.pt. 135°–138° C. (decomposition).

The resins used in the Examples are as follows:

Resin 1 denotes 3,4-epoxycyclohexylmethyl-3',4'-epoxycyclohexanecarboxylate having a 1,2-epoxide content of 7.3 equivs./kg.

Resin 2 denotes a styrene allyl alcohol copolymer having a molecular weight of 2340 and a hydroxyl content of 3.56 equiv./kg commercially available as "RJ 100" of Monsanto Chemical Company.

Resin 3 denotes 3,4-dihydro-2H-pyran-2-ylmethyl 3,4-dihydro-2H-pyran-2-carboxylate.

Resin 4 denotes a diglycidyl ether of 2,2-bis(4-hydroxyphenyl)propane having a 1,2-epoxide content of 5.2 equivs./kg.

Resin 5 denotes 1,4-butanediol diglycidyl ether having a 1,2-epoxide content of 9.3 equivs/kg.

Resin 6 denotes a bisphenol-terminated resin prepared by reacting a diglycidyl ether of 2,2-bis(4-hydroxyphenyl)propane with 2,2-bis(4-hydroxyphenyl)propane until an average molecular weight of 1820 is obtained.

Resin 7 denotes bis(3,4-epoxycyclohexylmethyl)adipate having a 1,2-epoxide content of 4.8 equivs./kg.

Resin 8 denotes a phenol-formaldehyde resol having a phenol:formaldehyde ratio of 1:1.14, a viscosity of 0.7 Pa s at 25° C. and a solids content of 76%, neutralised with 4-toluene-sulphonic acid.

EXAMPLE 1

A mixture of Resin 1 (100 parts), Resin 2 (100 parts) and diphenyliodosyl hexafluorophosphate (6 parts) is coated onto tinplate as a film having a thickness of 8–10 μm. Irradiation of the film for 2 seconds using a 80 w/cm medium pressure mercury lamp at a distance of 20 cm gives a tack-free coating.

EXAMPLE 2

A blend of Resin 1 (30 parts), Resin 2 (100 parts), Resin 4 (50 parts), Resin 5 (20 parts) and diphenyliodosyl hexafluorophosphate (6 parts) is spread onto tinplate to a thickness of 6–8 μm. Irradiation in the same manner as in Example 1 gives a tack-free coating after 3 seconds.

EXAMPLE 3

A mixture of Resin 2 (100 parts), Resin 3 (100 parts) and bis(4-methylphenyl)iodosyl hexafluorophosphate (6 parts) is coated onto tinplate to a thickness of 6–8 μm. Irradiation in the same manner as in Example 1 produces a tack-free surface after 25 seconds.

EXAMPLE 4

A mixture of Resin 6 (37.5 parts), Resin 1 (62.5 parts) and diphenyliodosyl hexafluoroarsenate (2 parts) is coated onto tinplate to a thickness of 8–10 μm. Irradiation in the same manner as in Example 1 gives a tack-free coating after 3 seconds.

EXAMPlE 5

A mixture of Resin 6 (50 parts), Resin 7 (50 parts) and diphenyliodosyl tetrafluoroborate (5 parts) is coated onto tinplate to a thickness of 6–8 μm. Irradiation in the same manner as in Example 1 gives a tack-free coating after 30 seconds.

EXAMPLE 6

A mixture of Resin 7 (50 parts), Resin 8 (50 parts) and diphenyliodosyl hexafluorophosphate (3 parts) is coated onto tinplate to a thickness of 6–8 μm and irradiated in the same manner as in Example 1. A tack-free coating is obtained after seconds.

EXAMPLE 7

A mixture of Resin 1 (100 parts), Resin 2 (100 parts), diphenyliodosyl hexafluorophosphate (6 parts) and copper II trichloroacetate (2 parts) is heated on a Kofler bench. A gel time of 15 minutes is recorded at a temperature of 120° C.

EXAMPLE 8

A mixture of Resin 2 (100 parts), Resin 4 (50 parts), Resin 1 (30 parts), Resin 5 (20 parts), diphenyliodosyl hexafluorophosphate (3 parts) and copper II acetylacetonate (1 part) is heated on a Kofler hot bench at 120° C. A gel time of 3½ minutes is obtained.

EXAMPLE 9

A mixture of Resin 1 (62.5 parts), Resin 6 (37.5 parts), diphenyliodosyl hexafluoroarsenate (3 parts) and tin II chloride is heated on a Kofler hot bench at 180° C. A gel time of 6 minutes is recorded.

EXAMPLE 10

A mixture of Resin 6 (50 parts), Resin 7 (50 parts), diphenyliodosyl tetrafluoroborate (5 parts) and benzoyl peroxide (1 part) is heated at 150° C. on a Kofler hot bench. A gel time of 90 seconds is obtained.

EXAMPLE 11

A mixture of Resin 2 (50 parts), Resin 3 (50 parts), bis(4-methylphenyl)iodosyl hexafluorophosphate (3 parts) and 2-isopropylthioxanthone (1 part) is coated onto tinplate as a film having a thickness of 6–8 μm. Irradiation of the film using a 80 w/cm medium pressure mercury lamp at a distance of 20 cm gives a tack-free surface after 15 seconds.

EXAMPLE 12

A mixture of Resin 2 (50 parts), Resin 3 (50 parts), bis(2-methylphenyl)iodosyl hexafluorophosphate (3 parts) and 2-isopropylthioxanthone (1 part) is coated onto tinplate to a thickness of 6–8 μm. Irradiation in the same manner as in Example 11 gives a tack-free surface after 20 seconds.

What is claimed is:
1. A polymerizable composition comprising
(A) a cationically polymerizable material,

(B) an epoxide-free organic hydroxy compound having at least one alcoholic hydroxyl group and having a molecular weight of more than 500, which is a polyoxyalkylene glycol or triol, a polyepichlorohydrin, a hydroxyl-terminated polycaprolactone, a polymer of a hydroxyalkyl acrylate or a hydroxyalkyl methacrylate, a copolymer of allyl alcohol with a vinyl monomer, a polyvinyl alcohol, a hydroxypropylcellulose, a hydroxyl-containing polyvinyl acetal, a resin obtained by reacting an epoxide resin with an excess of a compound containing one or more groups reactive with epoxide groups, or a phenolic resol, and (C) an aromatic iodosyl salt of formula

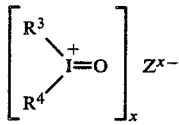

where
R$^3$ and R$^4$, which may be the same or different, each represent a monovalent aromatic radical having from 4 to 25 carbon atoms,
x denotes 1, 2 or 3, and
Z$^{x-}$ denotes an x-valent anion of a protic acid.

2. A composition according to claim 1, in which (A) is a 1,2-epoxide, a phenoplast, an aminoplast, or a cyclic vinyl ether.

3. A composition according to claim 2, in which (A) is a cycloaliphatic epoxide resin, a polyglycidyl ether of a polyhydric alcohol or polyhydric phenol, a cyclic vinyl ether containing a dihydropyran residue, or a phenol-formaldehyde resol, with the proviso that when (A) and (B) are each a phenol-formaldehyde resol, (A) is not the same resol as (B).

4. A composition according to claim 1, in which (B) is a copolymer of styrene and allyl alcohol, a phenol-formaldehyde resol, or a resin made by reacting a diglycidyl ether of 2,2-bis(4-hydroxyphenyl)propane with an excess of a monohydric or dihydric phenol.

5. A composition according to claim 1, in which (B) is present in an amount to provide from 0.001 to 10 equivalents of hydroxy compound per equivalent of cationically polymerizable material (A).

6. A composition according to claim 1, in which R$^3$ and R$^4$ in formula II are the same.

7. A composition according to claim 1, in which the groups R$^3$ and R$^4$ are optionally substituted phenyl groups.

8. A composition according to claim 1, in which the anion Z$^{x-}$ is derived from an organic carboxylic acid, an organic sulfonic acid Y—SO$_3$H, where Y denotes an aliphatic, aromatic or aliphatic-substituted aromatic group, any of which may be substituted by one or more halogen atoms or an inorganic acid.

9. A composition according to claim 8, in which the anion Z$^{x-}$ is an acetate, trifluoroacetate, methanesulfonate, benzenesulfonate, toluene-p-sulfonate, trifluoromethanesulfonate, fluoride, chloride, bromide, iodate, perchlorate, nitrate, sulfate, hydrogen sulfate, phosphate, or hydrogen phosphate.

10. A composition according to claim 8, in which the anion Z$^{x-}$ is a pentafluorohydroxoantimonate or is an anion of formula MQ$_w^-$ where
M represents an atom of a metal or metalloid,
Q represents a halogen atom, and
w is an integer of from 4 to 6 and is one more than the valency of M.

11. A composition according to claim 10, in which the anion Z$^{x-}$ is a hexafluoroantimonate, hexachloroantimonate, hexafluoroarsenate, pentachlorobismuthate, tetrachloroferrate, hexachlorostannate, tetrafluoroborate, or hexafluorophosphate.

12. A composition according to claim 1, which contains from 0.01% to 10% of the iodosyl salt of formula II, calculated on the weight of the cationically polymerizable material (A).

13. A photopolymerizable composition according to claim 1, which also contains a photochemical free radical generator, a photosensitizer or a dye which renders the composition more responsive to visible regions of the spectrum.

14. A heat-polymerizable composition according to claim 1, which also contains, as catalyst for the iodosyl salt, (D) a salt or complex of a d-block transition metal, a stannous salt, an organic peroxide, or an activated alpha-hydroxy compound which forms free radicals on heating to a temperature above 50° C.

15. A composition according to claim 14, in which (D) is dicumyl peroxide, tert.butyl perbenzoate, tert.butyl peroxide, benzoyl peroxide, or a salt or complex of zinc, cobalt, chromium, iron or copper.

16. A polymerized composition which is a polymerized product of a composition according to claim 1.

17. A process for the preparation of polymeric material which comprisies
(i) subjecting a composition according to claim 1 to radiation of wavelength such as to activate the iodosyl salt, and/or
(ii) subjecting the composition to heat in the presence, as catalyst for the iodosyl salt, of (D) a salt or complex of a d-block transition metal, a stannous salt, an organic peroxide or an activated alpha-hydroxy compound which forms free radicals on heating at a temperature above 50° C. until the composition is polymerized.

* * * * *